US011843012B2

(12) United States Patent
Usuki

(10) Patent No.: US 11,843,012 B2
(45) Date of Patent: Dec. 12, 2023

(54) SOLID-STATE IMAGING DEVICE

(71) Applicant: Sharp Semiconductor Innovation Corporation, Tenri (JP)

(72) Inventor: Takanori Usuki, Fukuyama (JP)

(73) Assignee: Sharp Semiconductor Innovation Corporation, Tenri (JP)

(*) Notice: Subject to any disclaimer, the term of this patent is extended or adjusted under 35 U.S.C. 154(b) by 266 days.

(21) Appl. No.: 17/520,314

(22) Filed: Nov. 5, 2021

(65) Prior Publication Data
US 2022/0173147 A1 Jun. 2, 2022

(30) Foreign Application Priority Data
Nov. 27, 2020 (JP) .................................. 2020-197355

(51) Int. Cl.
*H01L 27/146* (2006.01)
(52) U.S. Cl.
CPC .. *H01L 27/14623* (2013.01); *H01L 27/14625* (2013.01); *H01L 27/14638* (2013.01)
(58) Field of Classification Search
CPC ............. H01L 27/146; H01L 27/14601; H01L 27/1461; H01L 27/14623
USPC .......................................................... 348/294
See application file for complete search history.

(56) References Cited

U.S. PATENT DOCUMENTS

| 10,741,593 | B1* | 8/2020 | Mabuchi | H01L 27/14614 |
| 2018/0331148 | A1 | 11/2018 | Yokoyama et al. | |
| 2021/0399038 | A1* | 12/2021 | Tanaka | H01L 27/14623 |
| 2022/0130886 | A1* | 4/2022 | Zang | H01L 27/14643 |

FOREIGN PATENT DOCUMENTS

| CN | 110429091 A | * | 11/2019 | ....... H01L 27/14623 |
| JP | 2007287818 A | * | 11/2007 | ............. H01L 27/14 |
| WO | 2017/131009 A1 | | 8/2017 | |

* cited by examiner

*Primary Examiner* — Anthony J Daniels
(74) *Attorney, Agent, or Firm* — ScienBiziP, P.C.

(57) ABSTRACT

A solid-state imaging device includes: a plurality of pixels arranged in a matrix form on a substrate, wherein the plurality of pixels each include a photoelectric conversion region disposed inside the substrate and configured to convert light entering the substrate into charge, a charge retaining region disposed more on a side from which the light enters, than the photoelectric conversion region inside the substrate and configured to retain the charge converted in the photoelectric conversion region, an indented region indented from a surface of the substrate on the side from which the light enters, toward the photoelectric conversion region to at least a depth corresponding to the charge retaining region, and a light blocking film formed covering the charge retaining region at the surface side of the substrate and extending along a side wall of the indented region.

9 Claims, 19 Drawing Sheets

SOLID-STATE IMAGING DEVICE

CROSS-REFERENCE TO RELATED APPLICATION

The present application claims priority from Japanese Application JP2020-197355, the content of which is hereby incorporated by reference into this application.

BACKGROUND OF THE INVENTION

1. Field of the Invention

The present disclosure relates to a solid-state imaging device having a global shutter function.

2. Description of the Related Art

Solid-state imaging devices tend to have a pixel size reduced, in order to achieve high image quality without increasing the size of the solid-state imaging device. WO 2017/131009 pamphlet discloses a solid-state imaging device having a columnar protrusion portion, with a rectangular planar shape, provided on a transparent insulating film provided to a wiring line layer of the solid-state imaging device, to make incident light refracted to enter a light reception portion in a concentrated manner, so that a higher sensitivity and reduced optical noise are achieved.

SUMMARY OF THE INVENTION

However, the solid-state imaging device according to WO 2017/131009 pamphlet has a problem in that parasitic light sensitivity noise cannot be removed, the noise being generated in a case where the incident light refracted toward the light reception portion is diffracted by a light blocking film to enter a memory portion.

An object of the present disclosure is to provide a solid-state imagine device that can display an image having high image quality with high sensitivity, with the parasitic light sensitivity noise removed.

To solve the problem described above, a solid-state imaging device according to one aspect of the present disclosure includes: a plurality of pixels arranged in a matrix form on a substrate, and the plurality of pixels each include a photoelectric conversion region disposed inside the substrate and configured to convert light entering the substrate into charge, a charge retaining region disposed more on a side from which the light enters, than the photoelectric conversion region inside the substrate and configured to retain the charge converted in the photoelectric conversion region, an indented region indented from a surface of the substrate on the side from which the light enters, toward the photoelectric conversion region to at least a depth corresponding to the charge retaining region, and a light blocking film formed covering the charge retaining region at the surface side of the substrate and extending along a side wall of the indented region.

The solid-state imaging device according to one aspect of the present disclosure can display an image having high image quality with high sensitivity, with parasitic light sensitivity noise removed.

DETAILED DESCRIPTION OF THE INVENTION

First Embodiment

Hereinafter, one embodiment of the present disclosure will be described in detail.

Figure 1:
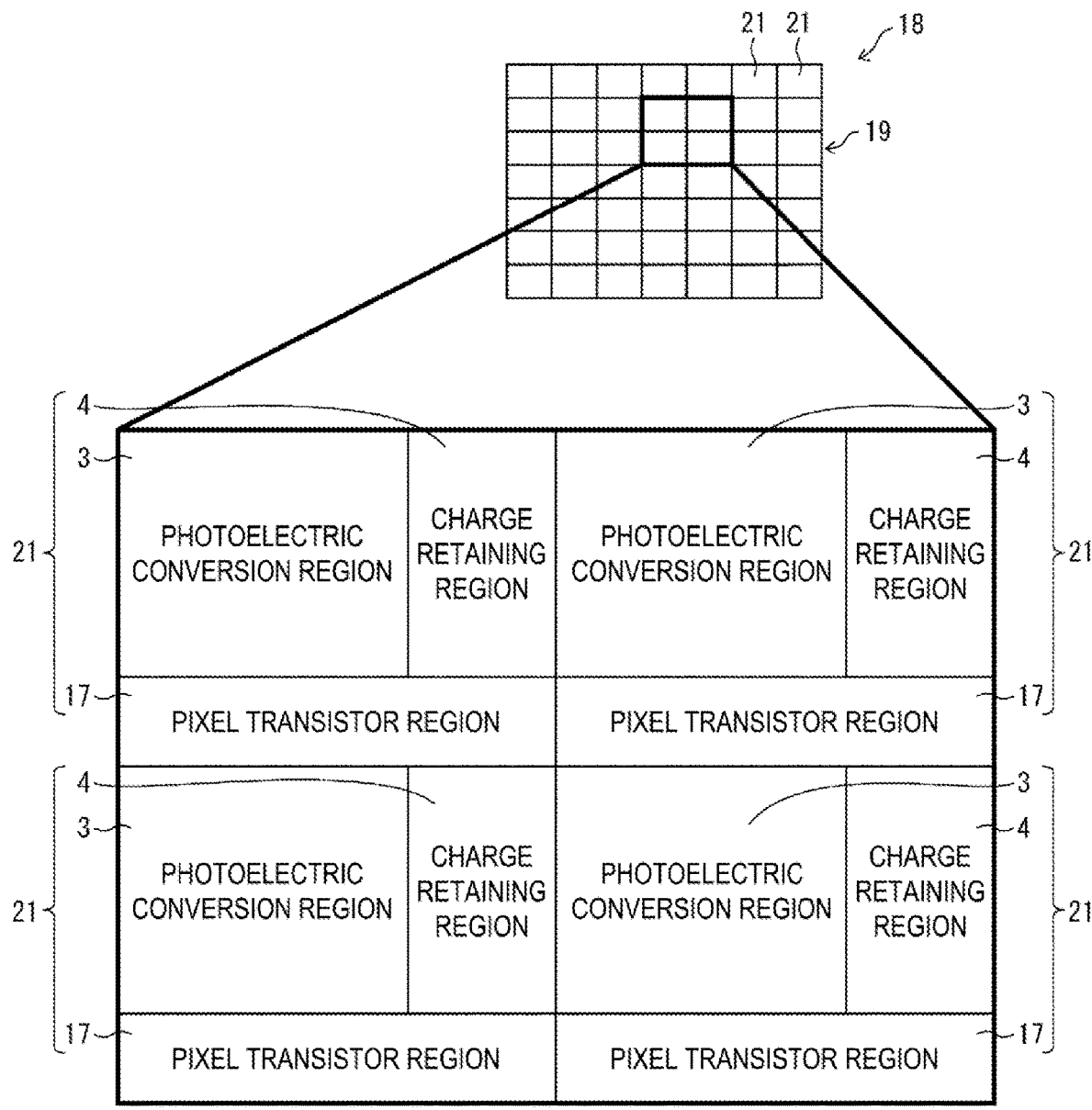
FIG. 1 is a diagram illustrating a configuration of pixels arranged in a solid-state imaging device according to a first embodiment.
Figure 2:
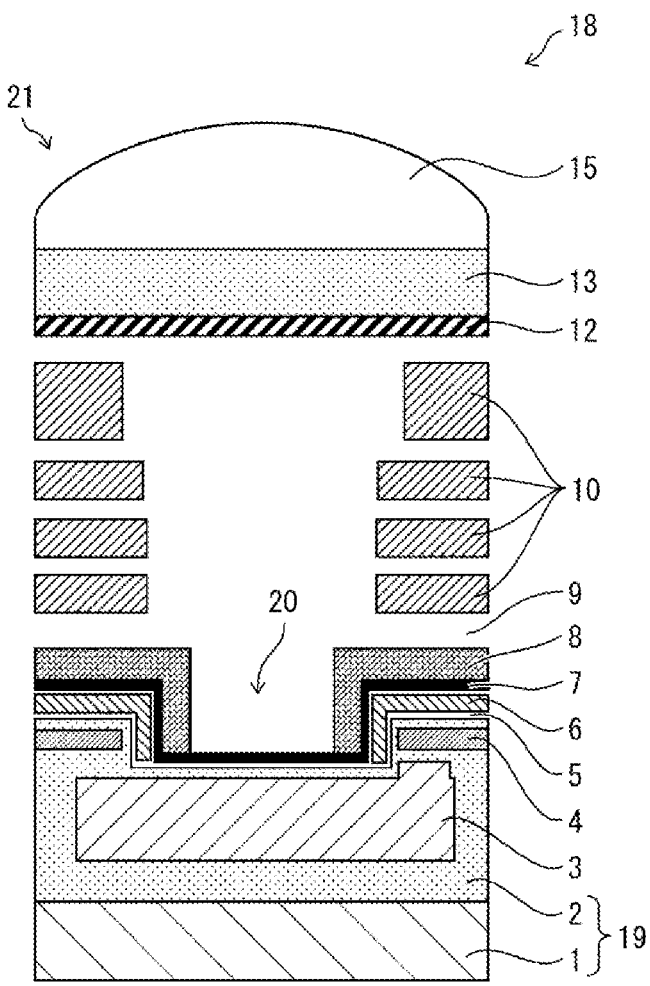
FIG. 2 is a structural cross-sectional view of a pixel of the solid-state imaging device according to the first embodiment.
Figure 3:
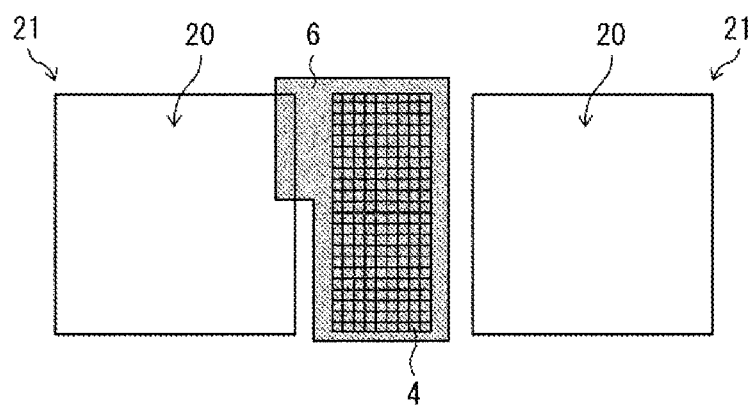
FIG. 3 is a plan view of pixels of the solid-state imaging device.

FIG. 1 is a diagram illustrating a configuration of pixels 21 arranged in a solid-state imaging device 18 according to a first embodiment. FIG. 2 is a structural cross-sectional view of a pixel 21 of the solid-state imaging device 18 according to the first embodiment. FIG. 3 is a plan view of the pixels 21.

The solid-state imaging device 18 includes a substrate 19. The substrate 19 includes a semiconductor substrate 1 and an epitaxial layer 2 formed on the semiconductor substrate 1.

The solid-state imaging device 18 includes the plurality of pixels 21 arranged in a matrix form on the substrate 19. Each pixel 21 includes: a photoelectric conversion region 3 for converting light that has entered the substrate 19 into charge; a charge retaining region 4 for retaining the charge as a result of the conversion by the photoelectric conversion region 3; and a pixel transistor region 17 in which a transistor is formed that is required for converting signal charge accumulated in a photoelectric conversion element formed in the photoelectric conversion region 3 into voltage and for resetting and selecting pixels.

The photoelectric conversion region 3 is disposed in the epitaxial layer 2 to convert the light that has entered the substrate 19 into charge. The charge retaining region 4 is disposed more on the side from which the light enters than the photoelectric conversion region 3 in the epitaxial layer 2.

Each pixel 21 includes: an indented region 20 indented to at least a depth corresponding to the charge retaining region 4 from the surface of the epitaxial layer 2 on the side from which the light enters toward the photoelectric conversion region 3; and a light blocking film 8 formed extending along side walls of the indented region 20 while covering the surface side of the epitaxial layer 2 of the charge retaining region 4 to block the light reaching the charge retaining region 4.

Each pixel 21 further includes a charge transfer gate electrode 6 for transferring charge from the photoelectric conversion region 3 to the charge retaining region 4. The charge as a result of the conversion from light by the photoelectric conversion region 3 is transferred from the photoelectric conversion region 3 to the charge retaining region 4, through a charge transfer path reaching the charge retaining region 4 via the charge transfer gate electrode 6.

The charge transfer path, in any embodiment, means a path from a region where the photoelectric conversion region 3 and the charge transfer gate electrode 6 overlap (to be precise, a region of the photoelectric conversion region 3 where the potential is the deepest when the charge transfer gate electrode 6 is ON) to a region of the charge retaining region 4 where the potential is the deepest.

An operation after the charge has been transferred to the charge retaining region 4 is the same as that in what is known as a general rolling shutter type CMOS Image Sensor (CIS). Specifically, before the charge is transferred from the charge retaining region 4 to a floating diffusion (FD), the FD is reset by a reset transistor and the charge of the FD at the time of the reset is converted into a voltage by a source follower transistor. Then, a reset signal is subjected to analog-to-digital conversion (AD conversion) with a select transistor selecting a detection pixel, and the result is acquired by a latch circuit. Thereafter, optical signal charge accumulated in the charge retaining region 4 is immediately transferred to the FD, and the charge transferred to the FD is converted into voltage by the source follower transistor. Then, the optical signal and the reset signal are subjected to AD conversion via the select transistor in the ON state, and the result is acquired by the latch circuit. Thereafter, the reset signal is subtracted from the optical signal and the reset signal by the digital circuit, whereby the signal obtained by the photoelectric conversion can be correctly acquired.

As illustrated in FIGS. 2 and 3, the charge transfer gate electrode 6 overlaps with both a portion of the photoelectric conversion region 3 where the potential is deep and the charge retaining region 4. Thus, a charge transfer path for transferring charge from the photoelectric conversion region 3 to the charge retaining region 4 is formed.

When the charge transfer gate electrode 6 is ON, an electric field is applied under the charge transfer gate electrode 6 and the potential under the charge transfer gate electrode 6 is modulated toward a deep side. In this case, the surface of the epitaxial layer 2 is strongly affected by the electric field. A potential slope of the charge retaining region 4, formed by impurity implantation and the layout, is inherited, resulting in a potential shape in which the potential at the time when the charge transfer gate electrode 6 is OFF is deepened by an offset amount.

Thus, the region of the photoelectric conversion region 3 where the potential is the deepest while the charge transfer gate electrode 6 is ON is formed under a region where the photoelectric conversion region 3 and the charge transfer gate electrode 6 overlap. Then, along the potential slope of the charge retaining region 4, being deeper than the region of the photoelectric conversion region 3 where the potential is the deepest due to the modulation in the charge transfer gate electrode 6, the charge moves to the region of the charge retaining region 4 where the potential is the deepest.

The photoelectric conversion region 3 is formed extending from the lower side of the indented region 20 to the lower side of the charge retaining region 4. The indented region 20 on the photoelectric conversion region 3 is formed to be indented to a position deeper than the charge retaining region 4. In this case, the charge is transferred perpendicularly from the photoelectric conversion region 3 below the charge retaining region 4 to the charge retaining region 4 directly above it. In order to appropriately configure the distance between the photoelectric conversion region 3 and the charge retaining region 4 in a location where the charge is transferred perpendicularly, a protrusion portion, protruding toward the charge retaining region 4, is formed in the photoelectric conversion region 3. Depending on the indented depth of the indented region 20 directly above the photoelectric conversion region 3, the protrusion portion may not be formed, or conversely, the distance between the photoelectric conversion region 3 and the charge retaining region 4 may need to be maintained in the location where the charge is transferred perpendicularly. In this transfer portion, the approximate distance between the photoelectric conversion region 3 and the charge retaining region 4 may be approximately from 0.35 μm to 0.45 μm.

An insulating film 5 is formed on the epitaxial layer 2.

The charge transfer gate electrode 6 is formed over the insulating film 5 and extends along the side walls of the indented region 20 to reach the bottom of the indented region 20.

An antireflective film 7 that reduces loss of light entering the substrate 19 is formed on the charge transfer gate electrode 6 and on the indented region 20. The light blocking film 8 is formed on the antireflective film 7.

The light blocking film 8 is formed to have a single or multiple film structure achieving a higher light reflectivity than a tungsten single layer.

Each pixel 21 includes at least one wiring line layer 10 that is provided on the light blocking film 8 and has a plurality of metal wires formed and an interlayer insulating film 9 formed on the light blocking film 8.

A known semiconductor substrate is used as the semiconductor substrate 1, and for example, a silicon substrate can be used. The photoelectric conversion region 3 may have any structure that can convert incident light into charge, and is configured, for example, by a photodiode. In a plurality of pixels 21 arranged in a matrix form, as illustrated in FIG. 1, the charge retaining region 4 is provided between the photoelectric conversion regions 3 adjacent to each other along a row direction. For example, the charge retaining region 4 is configured by an n-type layer in the epitaxial layer 2, and a potential barrier is formed between the photoelectric conversion region 3 and the charge retaining region 4.

The indented region 20 is formed above the photoelectric conversion region 3. The light blocking film 8 is disposed on the upper side of the charge retaining region 4 and the side walls of the indented region 20. The charge transfer gate electrode 6 covers the upper surface and the side surfaces of the charge retaining region 4 with the epitaxial layer 2 and the insulating film 3 provided in between.

The solid-state imaging device 18 of the present embodiment includes: a passivation film 12 covering the wiring line layer 10 and the interlayer insulating film 9 and having a higher refractive index than the interlayer insulating film 9; a flattening film 13 provided on the passivation film 12; and microlenses 15 disposed on the flattening film 13 to cover the photoelectric conversion region 3.

The passivation film 12 may be formed from a silicon nitride-based material, and the interlayer insulating film 9 may be formed from a silicon oxide-based material. Note that the "silicon nitride-based material" refers to a material having silicon nitride as a main component, and may include any impurities or the like. Furthermore, the "silicon oxide-based material" refers to a material having silicon oxide as a main component. Here, any impurities or the like may be included in the silicon oxide as long as the material has insulating properties.

As illustrated in FIG. 2, light that has entered the solid-state imaging device 18 of the present embodiment is refracted by a microlens 15 in a direction of the center axis of the microlens 15, to enter the flattening film 13 and the passivation film 12. Thereafter, the light passes through the interlayer insulating film 9 to enter the photoelectric conversion region 3. The light that has entered the photoelectric conversion region 3 is converted into charge. The charge as a result of this photoelectric conversion is transferred to the charge retaining region 4 by the application of voltage to the charge transfer gate electrode 6. The charge accumulated in the charge retaining region 4 is utilized as an image signal and configures a captured image through signal processing. Note that the solid-state imaging device 18 of the present embodiment employs a global shutter scheme, meaning that the photoelectric conversion in the photoelectric conversion region 3 and the transfer of the charge from the photoelectric conversion region 3 to the charge retaining region 4 are implemented at the same timing for all of the pixels.

When light directly enters the charge retaining region 4 during the photoelectric conversion described above, parasitic light sensitivity noise is generated. This is due to the photoelectric conversion also occurring in the charge retaining region 4.

The charge retaining region 4 has a donor such as and Ph formed in the epitaxial layer 2 containing Si through impurity implantation, and retains the charge primarily by a p-n junction capacity of a surface portion thus formed. Thus, as in the photodiode formed in the photoelectric conversion region 3, a carrier is generated in the charge retaining region 4 through photoelectric conversion when light enters therein.

In addition, even if no light directly enters the charge retaining region 4, some components of the charge, as a result of the photoelectric conversion in a p-region (pixel separation region) below the charge retaining region 4, reach the charge retaining region 4 due to diffusion.

Thus, in order to prevent light from entering the charge retaining region 4, the light blocking film 8 is provided on the upper surface and the side surface of the charge transfer gate electrode 6. A metal such as tungsten is used as a material configuring the light blocking film 8. Tungsten features a large light absorption coefficient and a high light-blocking capability even when a film formed therewith is thin, and thus is preferably used as a material for the light blocking film.

Figure 4:
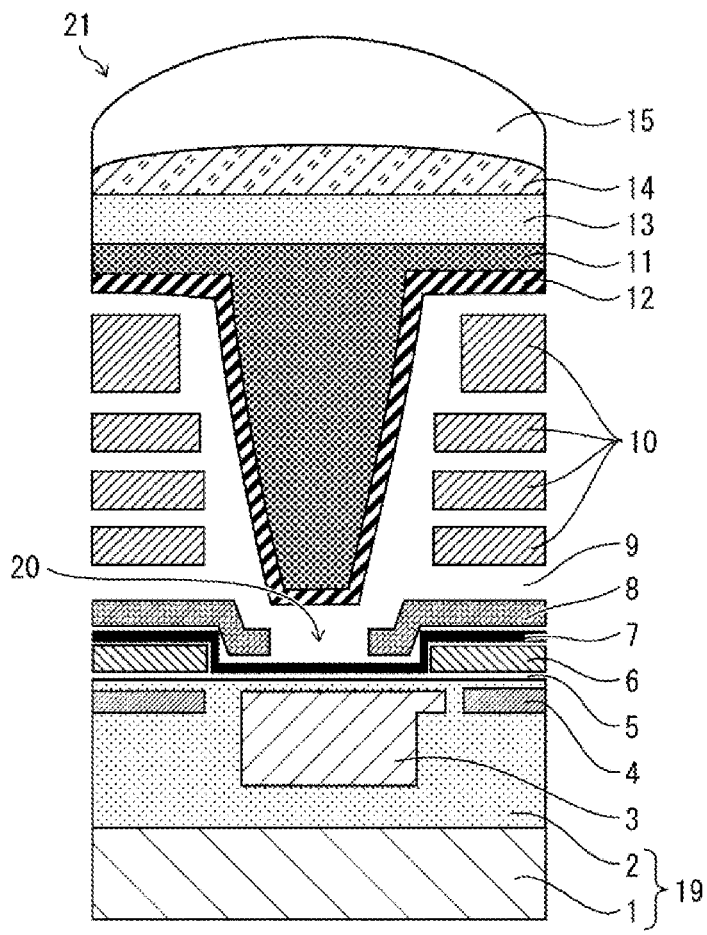
FIG. 4 is a structural cross-sectional view of a pixel of a solid-state imaging device according to a comparative example.
Figure 5:
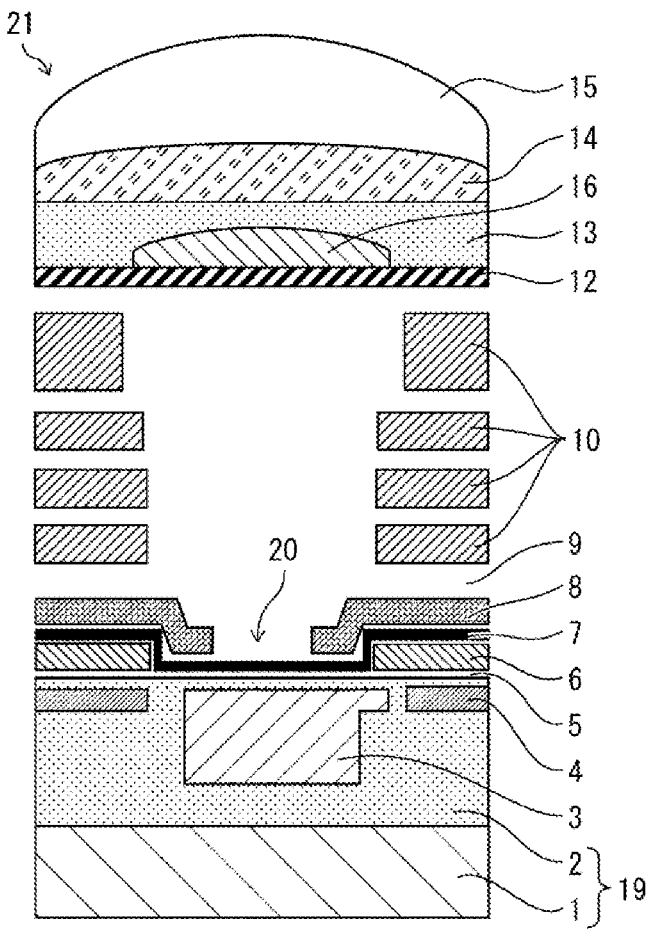
FIG. 5 is a structural cross-sectional view of a pixel of a solid-state imaging device according to another comparative example.

FIG. 4 is a structural cross-sectional view of a pixel of a solid-state imaging device according to a comparative example. FIG. 5 is a structural cross-sectional view of a pixel of a solid-state imaging device according to another comparative example.

Unlike the solid-state imaging device 18 of the first embodiment described above with reference to FIG. 2, the indented region 20 is indented, in the epitaxial layer 2, only to a position shallower than the charge retaining region 4. The upper surface of the photoelectric conversion region 3 and the upper surface of the charge retaining region 4 are disposed at the same depth in the epitaxial layer 2. The light blocking film 8 is disposed to cover the charge transfer gate electrode 6.

The solid-state imaging device illustrated in FIG. 4 includes a color filter 14 and an optical waveguide 11. The color filter 14 has a function of coloring incident light with red, green, and blue, and replacing light of each of the colors into an electrical signal in the photoelectric conversion region 3. The optical waveguide 11 has a function of condensing the incident light to the center axis of the pixel 21, to achieve efficient entrance into the photoelectric conversion region 3. The solid-state imaging device illustrated in FIG. 5 includes inner lenses 16 and the color filter 14.

With the structures of the solid-state imaging devices of the comparative examples illustrated in FIG. 4 and FIG. 5, light entering the substrate 19 not only enters the photoelectric conversion region 3 but also enters the charge retaining region 4, meaning that the photoelectric conversion also occurs in the charge retaining region 4. As a result, in the solid-state imaging devices of the comparative examples, the charge other than the charge as a result of the photoelectric conversion in the photoelectric conversion region 3 is accumulated in the charge retaining region 4 holding the signal charge for the immediately preceding frame, and thus the parasitic light sensitivity noise is generated.

On the other hand, in the solid-state imaging device 18 of the present embodiment, the photoelectric conversion region 3 is retracted from the position of the charge retaining region 4 toward the semiconductor substrate 1, and the photoelectric conversion region 3 extends along the lower surface of the charge retaining region 4. The indented region 20 is formed in an empty space formed by the retraction of the photoelectric conversion region 3 toward the semiconductor substrate 1.

The side walls of the indented region 20 face the side surfaces of the charge retaining region 4. The light blocking film 8 is formed to cover the surface side of the epitaxial layer 2 of the charge retaining region 4, and extend along the side walls of the indented region 20, with the antireflective film 7 and the charge transfer gate electrode 6 provided in between.

With such a configuration employed, light that has entered the epitaxial layer 2 through the interlayer insulating film 9 is blocked by the light blocking film 8 and thus cannot enter the charge retaining region 4. As a result, no photoelectric conversion occurs in the charge retaining region 4 and thus no parasitic light sensitivity noise occurs.

Furthermore, with the photoelectric conversion region 3 expanded to the lower side of the charge retaining region 4, not only the components of the charge, as a result of the photoelectric conversion in the p-region (pixel separation region) below the charge retaining region 4, reaching the charge retaining region 4 through diffusion can be reduced as much as possible, but the saturation capacity can also be improved. Furthermore, with no parasitic light sensitivity noise generated, a condensing structure on the substrate of the solid-state imaging device 18 of the present embodiment can be optimized only for the sake of improvement of the sensitivity and F number characteristics (oblique incidence characteristics) and of shading suppression.

The determination of the condensing structure often involves a trade-off relationship between the sensitivity and the parasitic light sensitivity noise. For example, a larger aperture of the light blocking film 8 on the photoelectric conversion region 3 results in an improved sensitivity but also results in degradation in terms of parasitic light sensitivity noise. Conversely, a smaller aperture results in a lower sensitivity but also results in improvement in terms of parasitic light sensitivity noise.

Actually, the condensing structure is designed with an aperture achieving balance between the sensitivity and the parasitic light sensitivity noise. Meanwhile, the condensing structure according to the present embodiment is fundamentally free of the parasitic light sensitivity noise. Thus, the aperture of the light blocking film 8 can be expanded to the manufacturing limit, and thus a condensing structure for improving the sensitivity without limit can be designed.

Furthermore, the condensing structure can be determined without taking into consideration a trade-off between the sensitivity and the parasitic light sensitivity noise, or a trade-off between shading (a sensitivity varying phenomenon in which the sensitivity generally becomes lower in pixels at ends of the screen, than that in pixels at the center of the screen, because light entering the pixels at the ends of the screen is angled, due to the light entering a CMOS image sensor through a lens at the time of imaging) and the parasitic light sensitivity noise. Thus, the condensing structure of the solid-state imaging device 18 according to the present embodiment can improve the sensitivity (optical characteristics).

The structures according to the comparative examples illustrated in FIG. 4 and FIG. 5 require a layout in which portions of the photoelectric conversion region 3 and the charge retaining region 4 where the potential is deep (main charge accumulation portions) are separated from each other at a certain distance, because they are both positioned on the outermost surface of the epitaxial layer 2 including Si. This is because such portions arranged close to each other leads to a shorter channel, resulting in a dramatic decrease in the saturation capacity (due to the photoelectric conversion region 3 being connected to a depletion layer of the charge retaining region 4). Such portions arranged close to each ether further result in deterioration in terms of blooming flooding toward the charge retaining region 4. Thus, the layout size of the pixels 21 is limited, so that the photoelectric conversion region 3 and the charge retaining region 4 are prevented from being too close to each other as described above. In a case of a pixel structure having a reset transistor for discharging electrons transferred to a pixel transistor (floating diffusion (FD)) in the pixel transistor region 17 of the pixel 21, a source follower transistor for converting charge into potential, a charge discharging transistor serving as an electron shutter, and a select transistor, the select transistor for pixel selection exists in the outermost surface of the epitaxial layer 2 including Si, and generally, the pixel transistor has the periphery surrounded by a shallow trench isolation (STI) to be separated from the photoelectric conversion region 3 and the charge retaining region 4. This is because the pixel transistor is implanted with impurities at a high concentration to involve a large amount of expansion of the depletion layer. Thus, without a sufficiently long distance, the depletion layer is connected to an N-type region such as the photoelectric conversion region 3. In such a case, the pixel transistor becomes a leak source. When the STI is formed, the expansion of the depletion layer can occur only through a section below the STI, meaning that the pixel transistor and the photoelectric conversion region 3 can be brought close to each other, with the distance therebetween being reduceable to the width of the STI. As described above, the pixel transistor also imposes limitation on the layout size of the photoelectric conversion region 3.

On the other hand, the main charge accumulation portion of the photoelectric conversion region 3 formed in the solid-state imaging device 18 illustrated in FIG. 2 (a portion where the potential is deep, which is preferably brought close to the charge retaining region 4 as much as possible) is positioned deep enough to be not affected by the charge retaining region 4 or the pixel transistor. Thus, the photoelectric conversion region 3 can be expanded up to a size sufficient for pixel separation from the photoelectric conversion region 3 formed in the adjacent pixel 21 (adjacent photodiode). Therefore, the saturation region of the photoelectric conversion region 3 can be much larger than that in the comparative examples.

Figure 6:
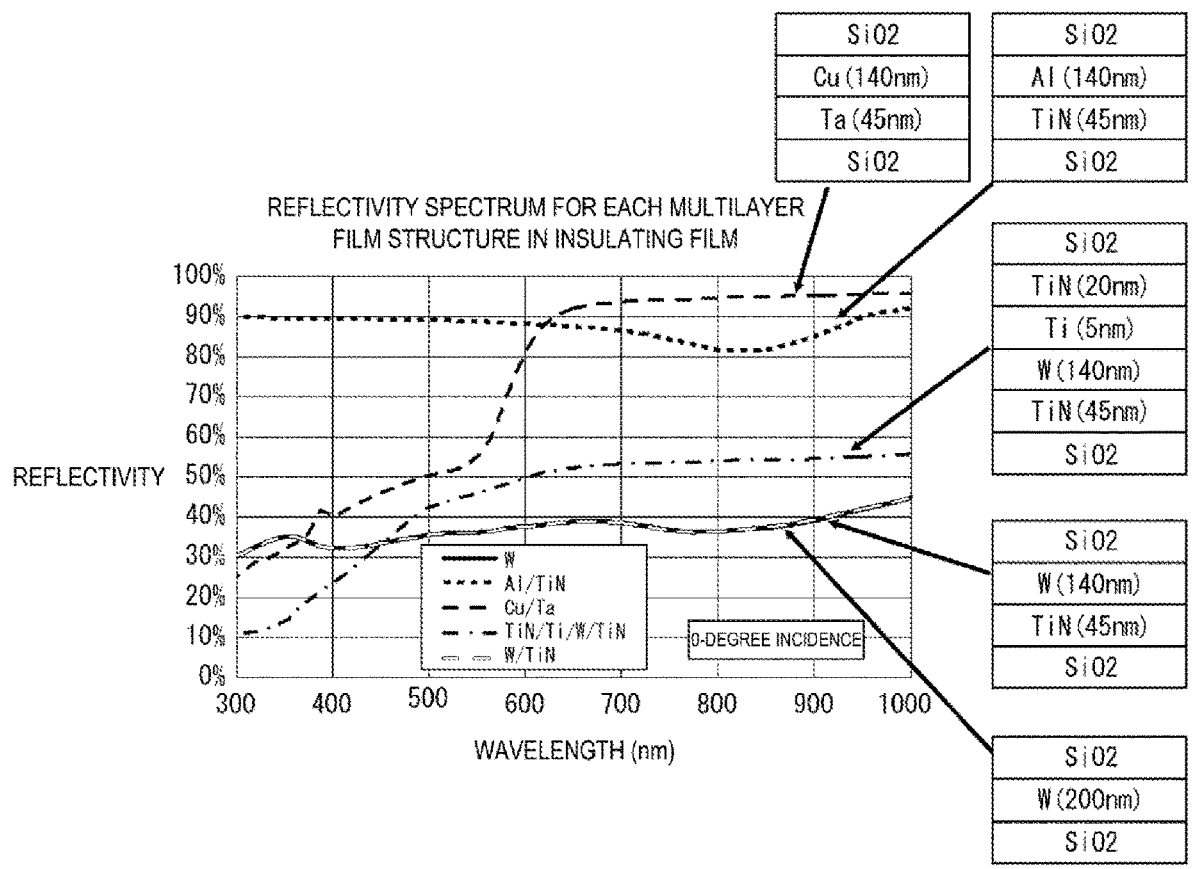
FIG. 6 is a graph showing reflectivity spectra with respect to the wavelength of a light blocking film provided in the solid-state imaging device according to the first embodiment.

FIG. 6 is a graph showing reflectivity spectra with respect to the wavelength of the light blocking film 8 provided in the solid-state imaging device 18 according to the first embodiment.

The single film structure of the light blocking film 8 achieving a higher light reflectivity than a tungsten (W) single layer includes, for example, a film structure of aluminum (Al)/titanium nitride (TiN), a film structure of copper (Cu)/tantalum (Ta), a film structure of W/TiN, and a film structure of TiN/Ti/W/TiN.

The graph in FIG. 6 shows results of simulating the reflectivity spectrum for each of the film structures described above. It can be seen that the film structure of Al/TiN and the film structure of Cu/Ta have significantly higher reflectivity than the film structure of a tungsten single layer in any wavelength region. Therefore, in consideration of the reflectivity alone, Al and Cu are appropriate for the material of the light blocking film 8 than W. However, a Cu film forming process is subjected to manufacturing process constraints because, in order to prevent diffusion of Cu into the insulating film after grooves for wiring line in the light blocking film are formed, the only possible way of forming is a process flow of forming a stable metal or metal compound, such as Ta or TaN, on the insulating film, embedding Cu in the light blocking film wiring grooves, and thereafter removing and flattening unnecessary portions by chemical mechanical polishing (CMP). In other words, the degree of freedom of the light blocking film structure is reduced. Furthermore, when Cu is diffused into the insulating film or the substrate surface, device characteristics are significantly degraded, such as deterioration of a white spot peak caused by metal contamination. For this reason, Cu is not actually employed in the light blocking film.

In addition, from the perspective of reliability and the like, as the light blocking film 8, the film structure of W/TiN, in which W is formed on a TiN film on an insulating film, is more preferably used than the tungsten single layer. The reflectivity spectrum of the W/TiN film structure is nearly the same as the reflectivity spectrum of the W single layer. Furthermore, the reflectivity can be increased by forming a TiN/Ti film on the W/TiN film. However, as a side effect at this time, the hydrogen occlusion property of Ti can act in a direction that interferes with the hydrogen termination effect at the interface state of the substrate, and the dark characteristics may be negatively affected.

Figure 7:
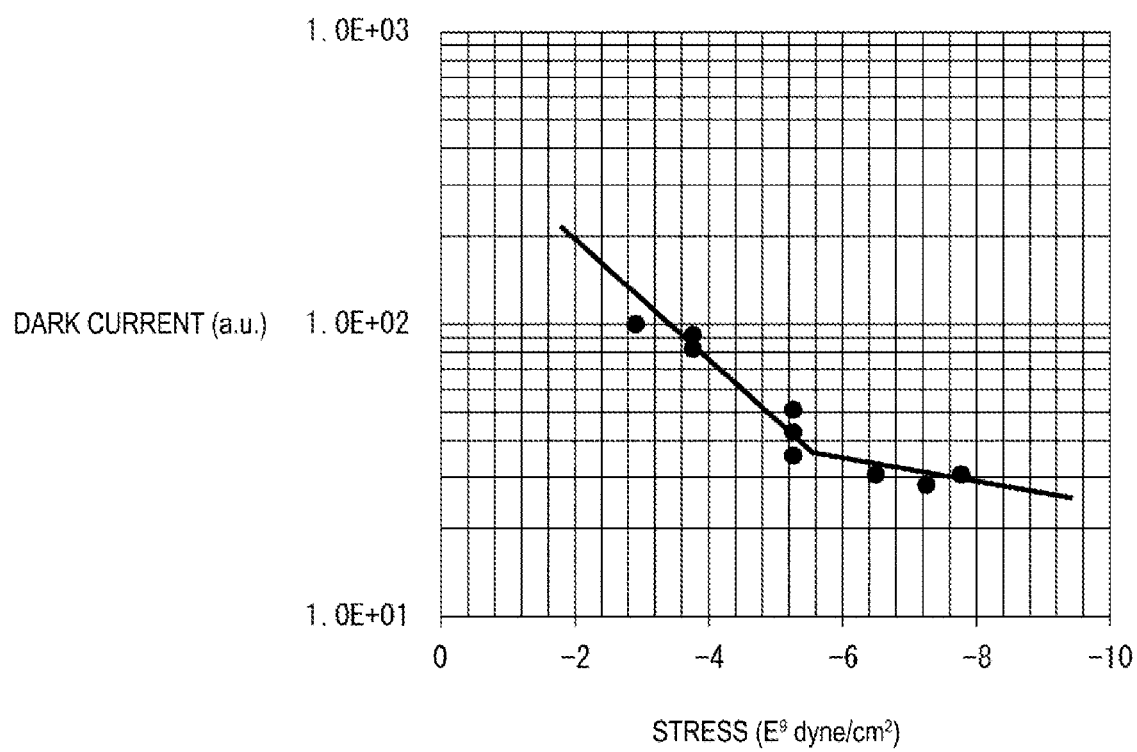
FIG. 7 is a graph showing the relationship between the stress of a passivation film provided in the solid-state imaging device according to the first embodiment and dark current.

FIG. 7 is a graph showing the relationship between the stress of the passivation film 12 provided in the solid-state imaging device 18 according to the first embodiment and dark current.

The passivation film 12 preferably has stress in a compressive direction of $-5.0 \times 10^{-9}$ dyne/cm$^2$ or less. Changing the film quality of the passivation film 12 also changes the refractive index, but the passivation film 12 has stress in the compressive direction, and warpage (stress applied to the entire image sensor) of the image sensor (the substrate 19 of the solid-state imaging device 18) can be adjusted to be $-5.0 \times 10^{-9}$ dyne/cm$^2$ or less.

This may overwhelm side effects caused by introduction of the optical waveguide 11. The optical waveguide 11 has a much greater heat shrink rate than the materials of the other surrounding members, such that the stress acting in the direction of exacerbating the dark voltage propagates to the substrate 19 including Si. Thus, it is important to determine the film quality of the passivation film 12 so as to adjust the warpage on the image sensor in a direction favorable for the dark current.

Controlling the stress of the passivation film 12 in the compressive direction causes the stress of the passivation film 12 in the compressive direction to propagate to the silicon on the surface of the epitaxial layer 2 including the photoelectric conversion region 3, thereby increasing a silicon bandgap on the surface of the epitaxial layer 2 including the photoelectric conversion region 3. As the band gap increases, the dark current is exponentially reduced.

As illustrated in FIG. 7, the change in the dark current becomes gentle when the stress in the compressive direction is $-5.0 \times 10^{-9}$ dyne/cm$^2$ or less, and thus setting the stress of the passivation film 12 in the compressive direction to be $-5.0 \times 10^{-9}$ dyne/cm$^2$ or less can exponentially reduce the dark current.

First Modified Example of First Embodiment

Figure 8:
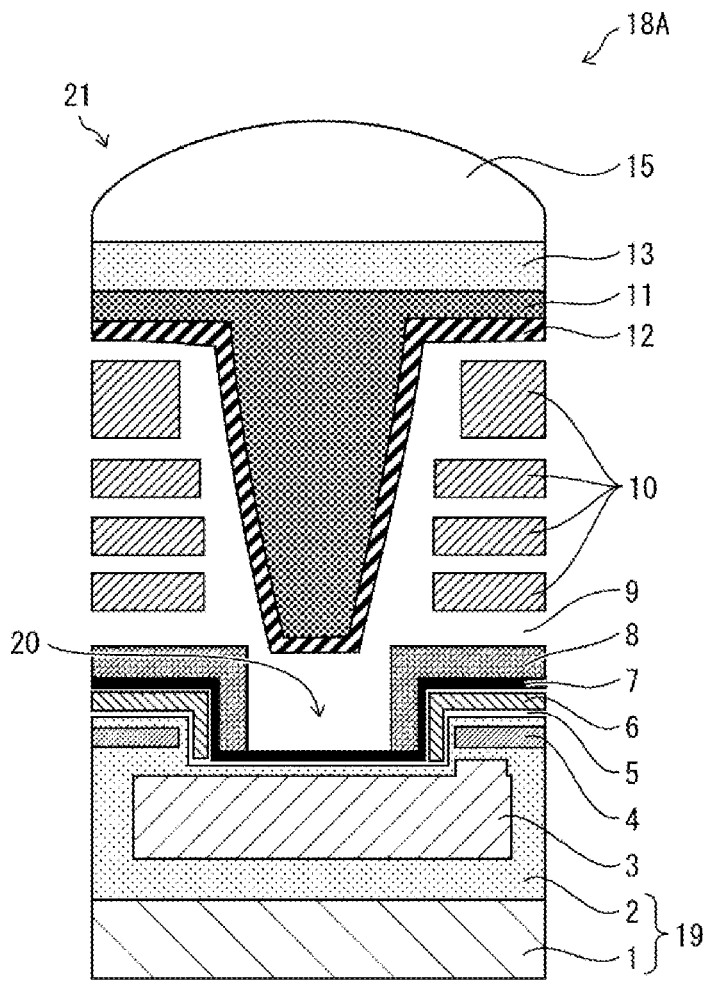
FIG. 8 is a structural cross-sectional view of a pixel of a solid-state imaging device according to a first modified example of the first embodiment.

FIG. 8 is a structural cross-sectional view of a pixel 21 of a solid-state imaging device 18A according to a first modified example of the first embodiment.

A difference from the solid-state imaging device 18 of the first embodiment is that the optical waveguide 11 is disposed between the passivation film 12 and the flattening film 13. Other structures and operations/effects are the same as those of the solid-state imaging device 18 of the first embodiment, and thus descriptions thereof will be omitted.

With the optical waveguide 11 disposed in the solid-state imaging device 18A, light that has entered the microlens 15 passes through the flattening film 13 to enter the optical waveguide 11. In the optical waveguide 11, the incident light is condensed to the center axis in a direction perpendicular to the substrate 19. The condensed incident light is emitted from the optical waveguide 11, and passes through the interlayer insulating film 9 to enter the photoelectric conversion region 3.

As described above, with the optical waveguide 11, the condensed light enters the photoelectric conversion region 3, and thus the amount of light entering the photoelectric conversion region 3 can be increased from that in a configuration without the optical waveguide 11 disposed. The solid-state imaging device 18A of the present embodiment can achieve a higher sensitivity.

With a Front Side Illumination (FSI) structure, the wiring line layer 10 is disposed on the light entering side. Thus, the wiring line layer 10 partially blocks the light condensed by the microlens 15, resulting in loss (metal vignetting). Furthermore, with a global shutter CIS, the charge retaining region 4 (memory node) also needs to be formed in the pixel 21, resulting in a smaller ratio of the aperture of the photoelectric conversion region 3 (photodiode portion) to the pixel area (fill factor). As a result, sensitivity and F number characteristics (oblique incidence characteristics) as well as shading characteristics are compromised.

An optical waveguide structure serves as a solution to these. Specifically, with a material featuring a higher-refractive index than the interlayer insulating film 9 used for the optical waveguide 11, an effect of confining light is provided. Specifically, once light condensed from the microlens 15 enters an inlet (upper side aperture) of the optical waveguide 11, the light can be emitted from an outlet (lower side aperture) without leaking to the surrounding, meaning that the light entering the microlens 15 can be efficiently guided to the photoelectric conversion region 3.

The optical waveguide 11 is especially effective in the configuration of the present embodiment in which a distance from the microlens 15 to the substrate 19 is long due to the section immediately above the photoelectric conversion region 3 indented. As long as the incident light is guided to the indented region 20 by the optical waveguide 11, no parasitic light sensitivity noise (PLS) occurs regardless of the direction of the light exiting the optical waveguide 11 to enter the substrate 19. This enables designing without the need to take the taper angle of the optical waveguide 11 into consideration, resulting in a higher degree of freedom, whereby improvement in terms of sensitivity, F number characteristics, and shading is facilitated.

Second Modified Example of First Embodiment

Figure 9:
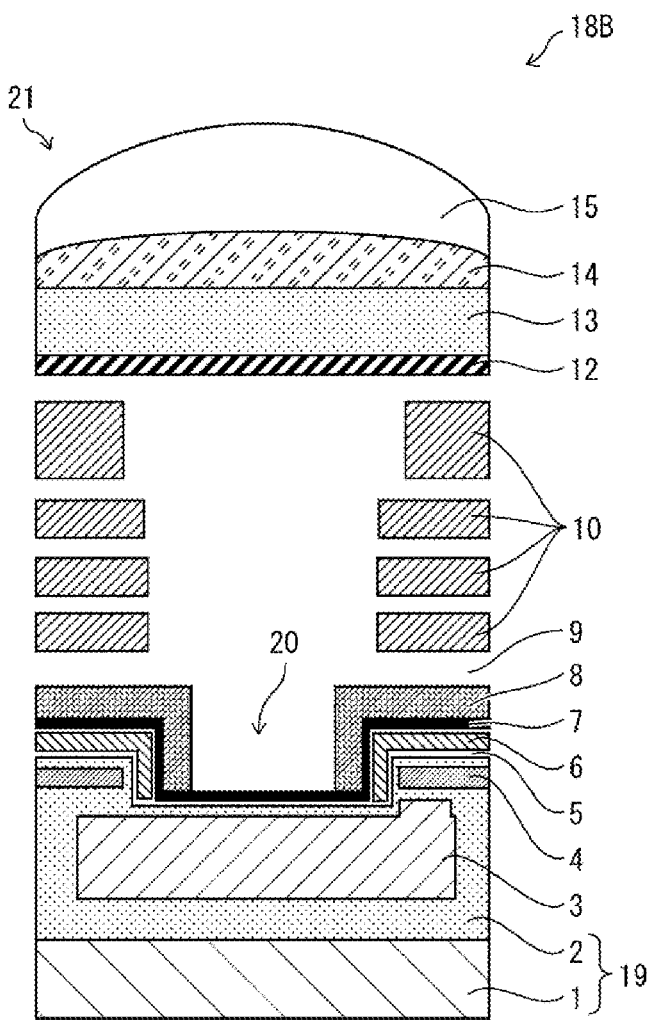
FIG. 9 is a structural cross-sectional view of a pixel of a solid-state imaging device according to a second modified example of the first embodiment.

FIG. 9 is a structural cross-sectional view of a pixel 21 of a solid-state imaging device 18B according to a second modified example of the first embodiment.

A difference from the solid-state imaging device 18 of the first embodiment is that the color filter 14 is disposed between the flattening film 13 and the microlens 15. Other structures and operations/effects are the same as those of the solid-state imaging device 18 of the first embodiment, and thus descriptions thereof will be omitted.

With the color filter 14 disposed in the solid-state imaging device 18B, light of a predetermined wavelength that has entered the microlens 15 passes through the color filter 14, and light of the other wavelengths is absorbed by the color filter 14. Thus, only the light of the predetermined wavelength enters the photoelectric conversion region 3 to be subjected to the photoelectric conversion.

In the solid-state imaging device 18B of the present embodiment, the color filter 14 with the wavelength of light to pass through changed for each pixel 21 is disposed as described above, whereby light of any of red, green, and blue colors, which are the three primary colors of light, can be converted into an electrical signal in each pixel 21. With the light of the three colors, red, green, and blue converted into electrical signals and the electrical signals converted back to light, a color image can be displayed.

Third Modified Example of First Embodiment

Figure 10:
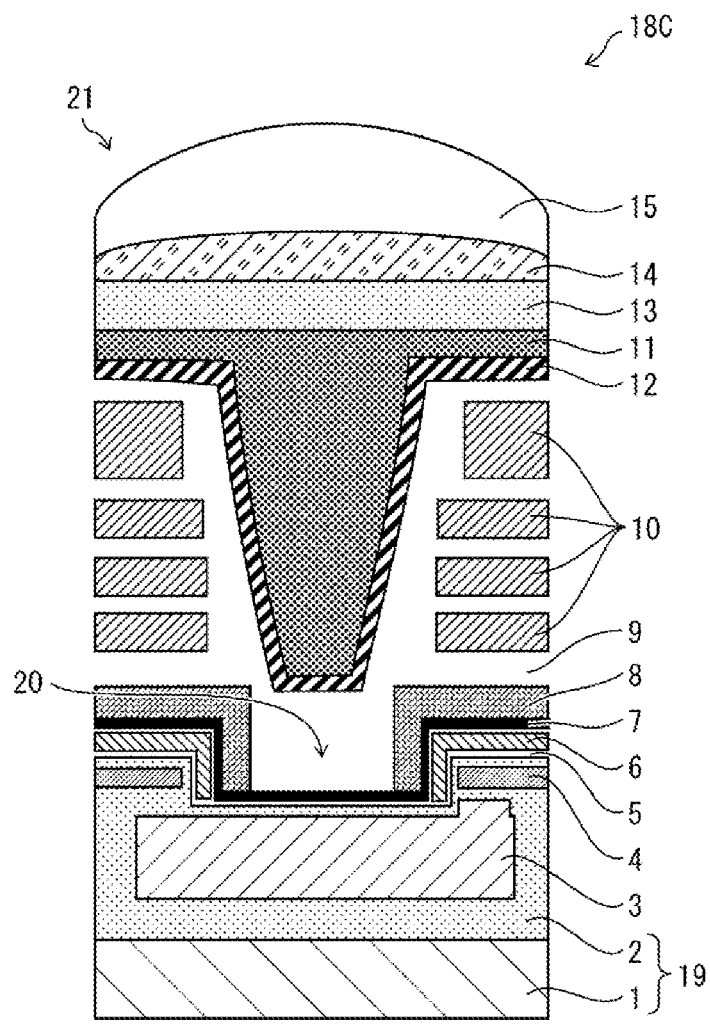
FIG. 10 is a structural cross-sectional view of a pixel of a solid-state imaging device according to a third modified example of the first embodiment.

FIG. 10 is a structural cross-sectional view of a pixel 21 of a solid-state imaging device 18C according to a third modified example of the first embodiment.

A difference from the solid-state imaging device 18 of the first embodiment, is that the optical waveguide 11 is disposed between the passivation film 12 and the flattening film 13 and that the color filter 14 is disposed between the flattening film 13 and the microlens 15. Other structures and operations/effects are the same as those of the solid-state imaging device 18 of the first embodiment, and thus descriptions thereof will be omitted.

The solid-state imaging device 18C of the present embodiment is a combination of the first modified example and the second modified example of the first embodiment. With the color filter 14 disposed in the solid-state imaging device 18C, light of a predetermined wavelength that has entered the microlens 15 passes through the color filter 14, and light of the other wavelengths is absorbed by the color filter 14. The light of the predetermined wavelength that has passed through the color filter 14 passes through the flattening film 13 to enter the optical waveguide 11. In the optical waveguide 11, the incident light of the predetermined wavelength is condensed to the center axis in a direction perpendicular to the substrate 19. The condensed incident light of the predetermined wavelength is emitted from the optical waveguide 11, and passes through the interlayer insulating film 9 to enter the photoelectric conversion region 3.

As described above, with the solid-state imaging device 18C of the present embodiment, the amount of light entering the photoelectric conversion region 3 can be increased, with only the light of the predetermined wavelength extracted. With the optical waveguide 11 and the color filter 14 disposed in the solid-state imaging device 18C, a color image with a higher sensitivity can be displayed.

Fourth Modified Example of First Embodiment

Figure 11:
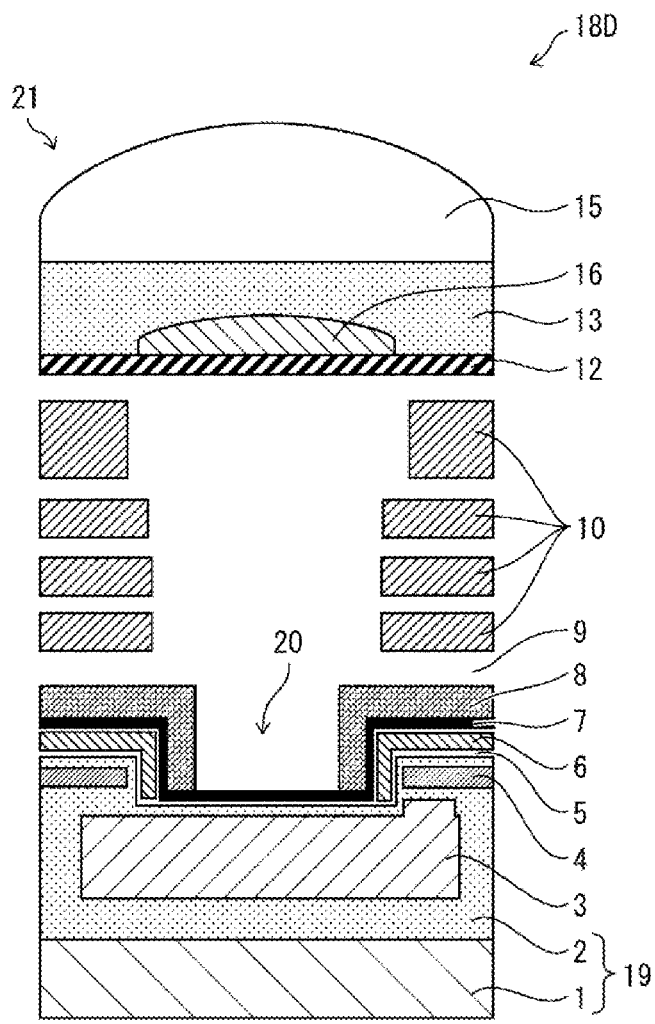
FIG. 11 is a structural cross-sectional view of a pixel of a solid-state imaging device according to a fourth modified example of the first embodiment.

FIG. 11 is a structural cross-sectional view of a pixel 21 of a solid-state imaging device 18D according to a fourth modified example of the first embodiment.

A difference from the solid-state imaging device 18 of the first embodiment is that the inner lens 16 is disposed between the passivation film 12 and the flattening film 13. Other structures and operations/effects are the same as those of the solid-state imaging device 18 of the first embodiment, and thus descriptions thereof will be omitted.

With the inner lens 16 disposed in the solid-state imaging device 18D, the incident light that has passed through the microlens 15 passes through the flattening film 13 to enter the inner lens 16, and thus is condensed to the center axis in a direction perpendicular to the substrate 19. The condensed incident light passes through the passivation film 12 and the interlayer insulating film 9, to enter the photoelectric conversion region 3. With the inner lens 16 disposed, the incident light from the outside can be condensed and enter the photoelectric conversion region 3.

As a result, the incident light from the outside can be efficiently converted into electrons in the photoelectric conversion region 3, whereby the sensitivity can further be improved.

As described above, the global shutter CIS of FSI type has a problem in that the condensing rate is compromised due to a reduced fill factor. With the inner lens 16 as described above used in addition to the optical waveguide structure described above, the light incident from the microlens 15 can be efficiently condensed on the substrate 19.

Fifth Modified Example of First Embodiment

Figure 12:
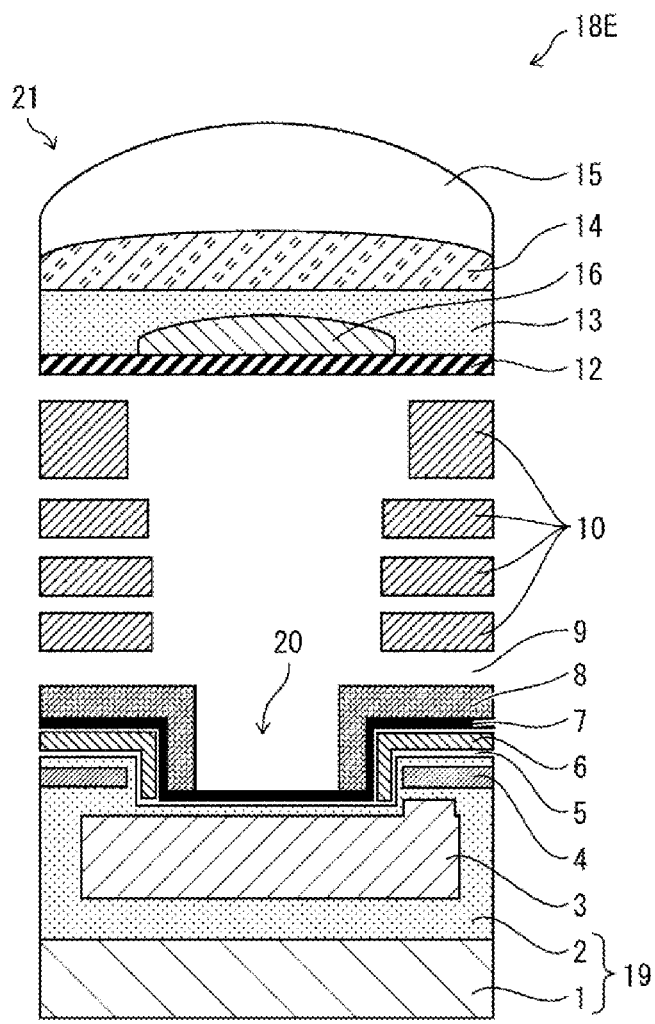
FIG. 12 is a structural cross-sectional view of a pixel of a solid-state imaging device according to a fifth modified example of the first embodiment.

FIG. 12 is a structural cross-sectional view of a pixel 21 of a solid-state imaging device 18E according to a fifth modified example of the first embodiment.

A difference from the solid-state imaging device 18 of the first embodiment is that the inner lens 16 is disposed between the passivation film 12 and the flattening film 13 and that the color filter 14 is disposed between the flattening film 13 and the microlens 15. Other structures and operations/effects are the same as those of the solid-state imaging device 18 of the first embodiment, and thus descriptions thereof will be omitted.

The solid-state imaging device 18E of the present embodiment is a combination of the second modified example and the fourth modified example of the first embodiment. With the color filter 14 disposed in the solid-state imaging device 18E, light of a predetermined wavelength that has entered the microlens 15 passes through the color filter 14, and light of the other wavelengths is absorbed by the color filter 14. The light of the predetermined wavelength that has passed through the color filter 14 passes through the flattening film 13 to enter the inner lens 16. In the inner lens 16, the incident light of the predetermined wavelength is condensed to the center axis in a direction perpendicular to the substrate 19. The condensed incident light of the predetermined wavelength is emitted from the inner lens 16, and passes through the interlayer insulating film 9 to enter the photoelectric conversion region 3.

As described above, with the solid-state imaging device 18E of the present embodiment, the amount of light entering the photoelectric conversion region 3 can be increased, with only the light of the predetermined wavelength extracted. With the inner lens 16 and the color filter 14 disposed in the solid-state imaging device 18E, a color image with a higher sensitivity can be displayed.

Sixth Modified Example of First Embodiment

Figure 13:
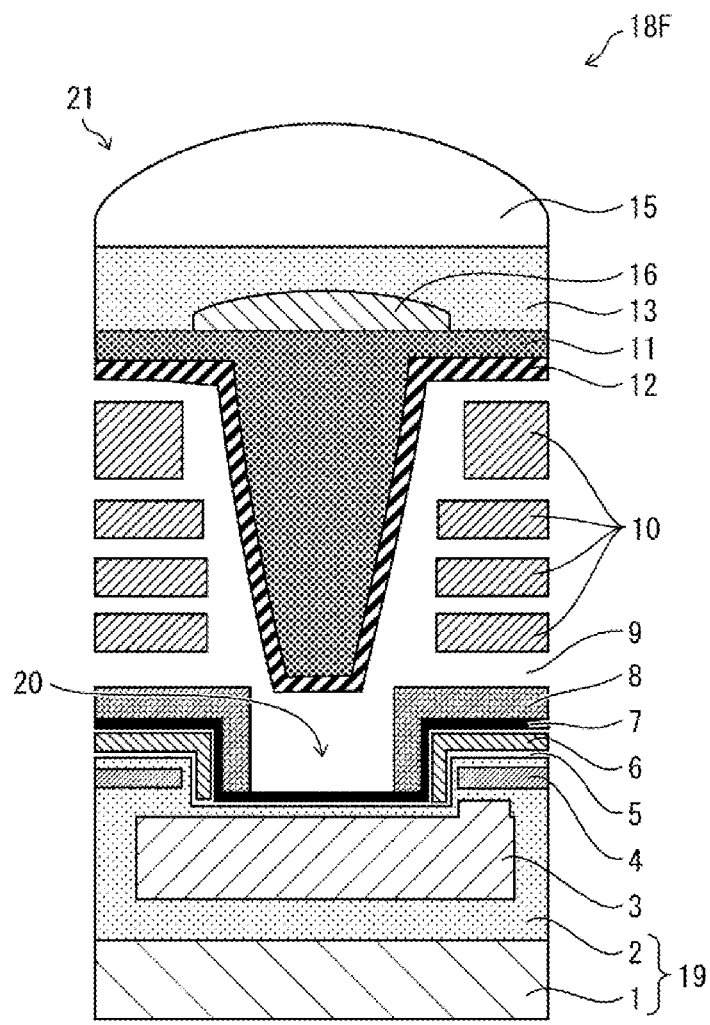
FIG. 13 is a structural cross-sectional view of a pixel of a solid-state imaging device according to a sixth modified example of the first embodiment.

FIG. 13 is a structural cross-sectional view of a pixel 21 of a solid-state imaging device 18F according to a sixth modified example of the first embodiment.

A difference from the solid-state imaging device 18 of the first embodiment is that the optical waveguide 11 and the inner lens 16 are disposed between the passivation film 12 and the flattening film 13. Other structures and operations/effects are the same as those of the solid-state imaging device 18 of the first embodiment, and thus descriptions thereof will be omitted.

The light that has entered the microlens 15 passes through the flattening film 13 to enter the inner lens 16, and thus is condensed to the center axis in a direction perpendicular to the substrate 19. The condensed incident light enters the optical waveguide 11. In the optical waveguide 11, the incident light of the predetermined wavelength is condensed to the center axis in a direction perpendicular to the substrate 19. The condensed incident light of the predetermined wavelength is emitted from the optical waveguide 11, and passes through the interlayer insulating film 9 to enter the photoelectric conversion region 3.

Seventh Modified Example of First Embodiment

Figure 14:
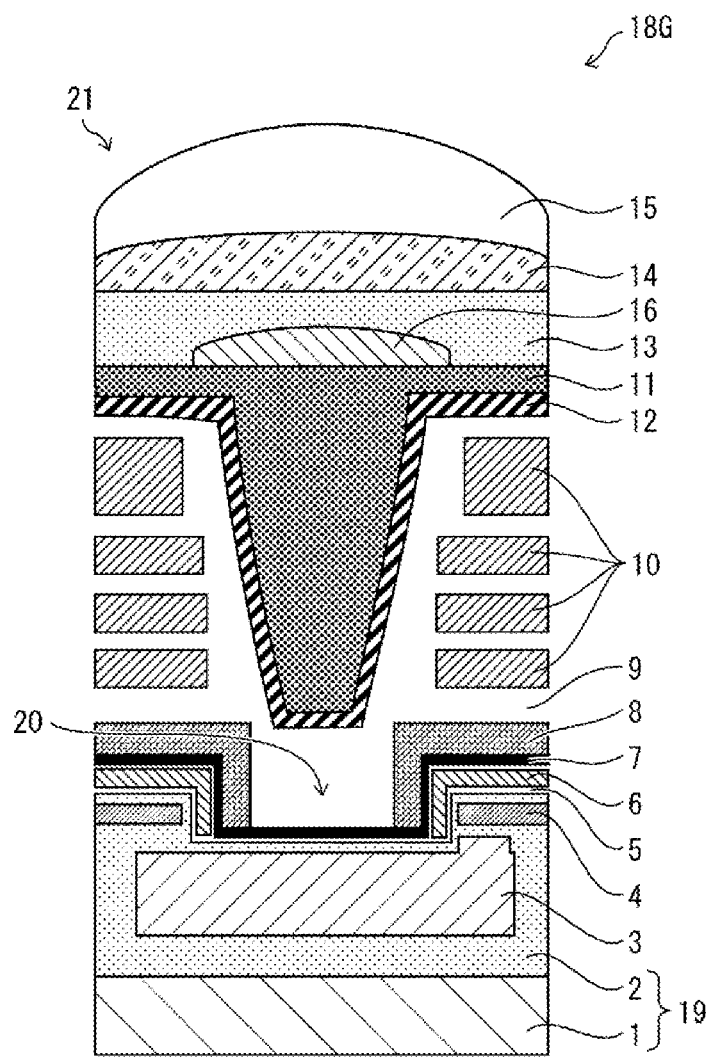
FIG. 14 is a structural cross-sectional view of a pixel of a solid-state imaging device according to a seventh modified example of the first embodiment.

FIG. 14 is a structural cross-sectional view of a pixel 21 of a solid-state imaging device 18G according to a seventh modified example of the first embodiment.

A difference from the solid-state imaging device 18 of the first embodiment is that the optical waveguide 11 and the inner lens 16 are disposed between the passivation film 12 and the flattening film 13 and that the color filter 14 is disposed between the flattening film 13 and the microlens 15. Other structures and operations/effects are the same as those of the solid-state imaging device 18 of the first embodiment, and thus descriptions thereof will be omitted.

Light of a predetermined wavelength that has entered the microlens 15 passes through the color filter 14, and light of the other wavelengths is absorbed by the color filter 14. The light of the predetermined wavelength that has passed through the color filter 14 passes through the flattening film 13 to enter the inner lens 16. In the inner lens 16, the incident light of the predetermined wavelength is condensed to the center axis in a direction perpendicular to the substrate 19. The condensed incident light of the predetermined wavelength is emitted from the inner lens 16 to enter the optical waveguide 11. In the optical waveguide 11, the incident light of the predetermined wavelength is condensed to the center axis in a direction perpendicular to the substrate 19. The condensed incident light of the predetermined wavelength is emitted from the optical waveguide 11, and passes through the inter layer insulating film 9 to enter the photoelectric conversion region 3.

Eighth Modified Example of First Embodiment

Figure 15:
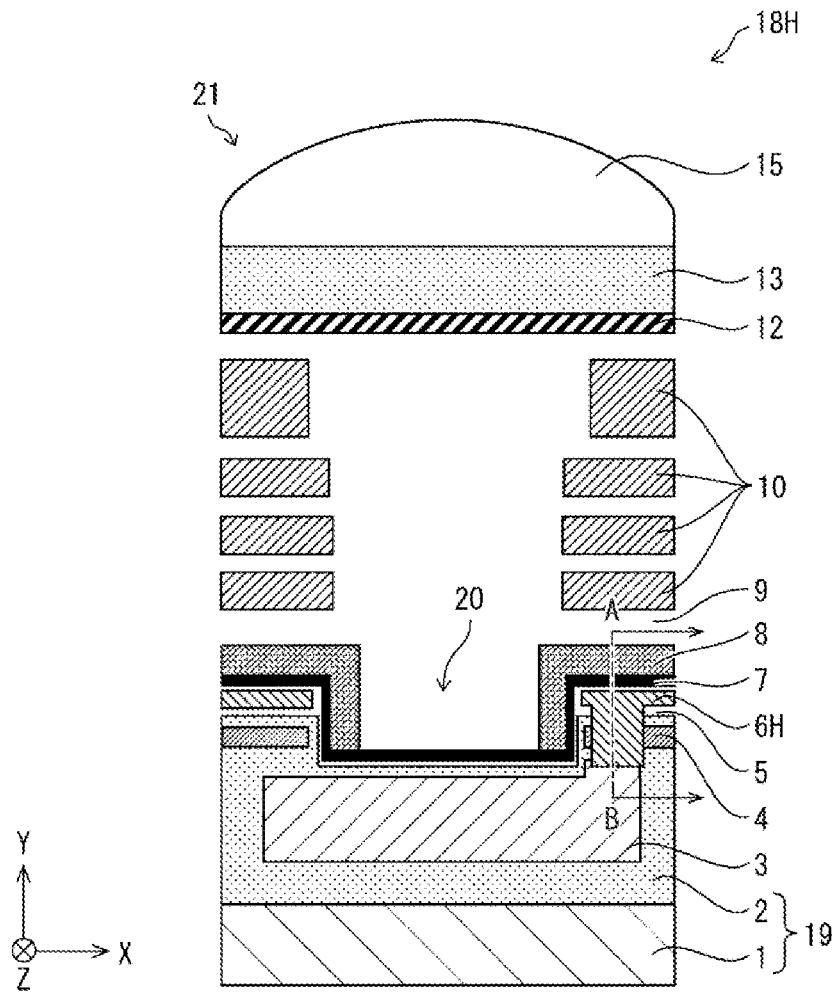
FIG. 15 is a structural cross-sectional view of a pixel of a solid-state imaging device according to an eighth modified example of the first embodiment.
Figure 16:
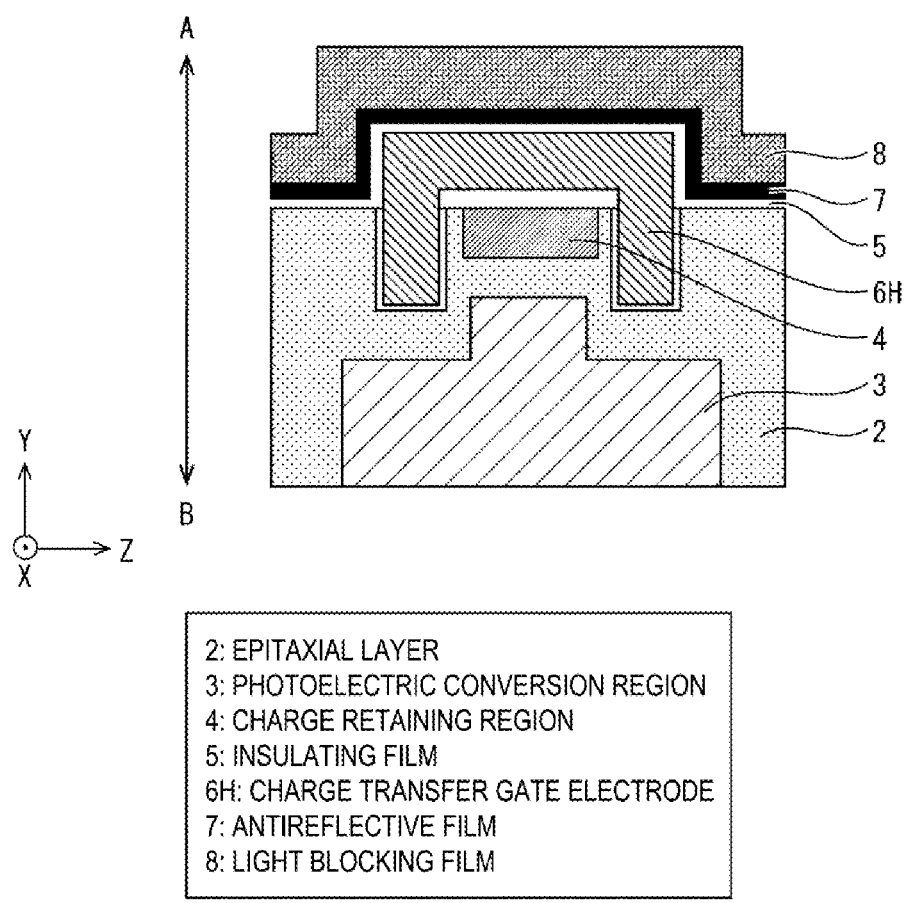
FIG. 16 is a cross-sectional view taken along line AB illustrated in FIG. 15.
Figure 17:
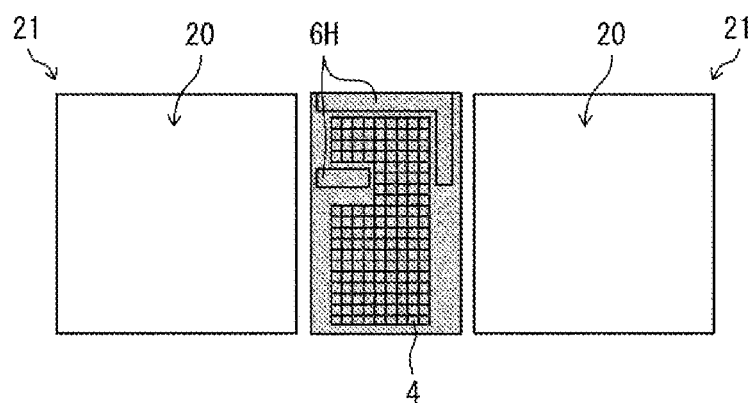
FIG. 17 is a plan view of pixels of the solid-state imaging device.

FIG. 15 is a structural cross-sectional view of a pixel 21 of a solid-state imaging device 18H according to an eighth modified example of the first embodiment. FIG. 16 is a cross-sectional view taken along line AB illustrated in FIG. 15. FIG. 17 is a plan view of the pixel 21.

A difference from the solid-state imaging device 18 of the first embodiment is that a charge transfer gate electrode 6H is embedded in the epitaxial layer 2 to cover both side surfaces of the charge retaining region 4 to sandwich the charge retaining region 4. Other structures and operations/effects are the same as those of the solid-state imaging device 18 of the first embodiment, and thus descriptions thereof will be omitted.

Light that has entered the solid-state imaging device 18H is refracted by the microlens 15 in a direction of the center axis of the microlens 15, to enter the flattening film 13 and the passivation film 12. Thereafter, the light passes through the interlayer insulating film 9 to enter the photoelectric conversion region 3.

The light that has entered the photoelectric conversion region 3 is converted into charge. The charge as a result of this photoelectric conversion is transferred to the charge retaining region 4 by the application of voltage to the charge transfer gate electrode 6H.

As illustrated in FIG. 15 to FIG. 17, the charge transfer gate electrode 6H overlaps with both a portion of the photoelectric conversion region 3 where the potential is deep and the charge retaining region 4. Thus, a charge transfer path for transferring charge from the photoelectric conversion region 3 to the charge retaining region 4 is formed.

With the charge transfer gate electrode 6H thus embedded in the epitaxial layer 2 to cover both side surfaces of the charge retaining region 4 to sandwich the charge retaining region 4, the charge can be transferred from the photoelectric conversion region 3 to the charge retaining region 4, even if the charge transfer gate electrode 6H is not formed between the side walls of the indented region 20 and the charge retaining region 4.

With such a structure where the charge transfer gate electrode 6H is embedded, formation of potential advantageous in terms of transfer of charge from the photoelectric conversion region 3 to the charge retaining region 4 is facilitated. Thus, the dimensions of the aperture in the light blocking film 8 extending along the side walls of the indented region 20 can be increased by an amount achieved by the absence of the charge transfer gate electrode 6H between the side walls of the indented region 20 and the charge retaining region 4. Therefore, the condensing rate of the photoelectric conversion region 3 is increased, whereby the sensitivity of the solid-state imaging device 18H is improved.

With Si etched as in the case of the shallow trench isolation (STI) and with a polysilicon gate electrode embedded in the epitaxial layer 2 as described above, a configuration is achieved in which the charge transfer gate electrode 6H is embedded on both sides of the charge retaining region 4, and voltage is applied to the charge retaining region 4 from both sides of the charge retaining region 4 to assist the charge transfer.

Note that although FIG. 16 and FIG. 17 illustrate a structure in which the charge retaining region 4 is sandwiched by the charge transfer gate electrode 6H from both sides, the charge transfer gate electrode 6H may be provided only on one side of the charge retaining region 4.

Second Embodiment

Another embodiment of the present disclosure will be described below. Note that, for convenience of explanation, components having a function identical to those in the above-described embodiment will be denoted by the same reference signs, and descriptions of those components will be omitted.

Figure 18:
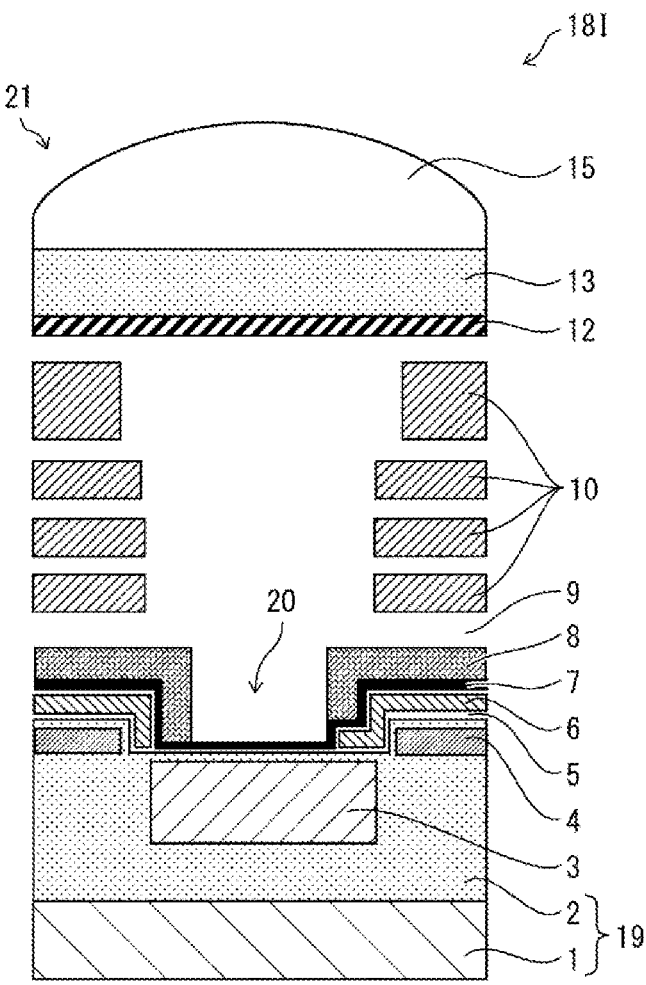
FIG. 18 is a structural cross-sectional view of a pixel of a solid-state imaging device according to a second embodiment.

FIG. 18 is a structural cross-sectional view of a pixel 21 of a solid-state imaging device 18I according to a second embodiment. A difference from the solid-state imaging device 18 of the first embodiment is that the depth of the indented region 20 immediately above the photoelectric conversion region 3 is shallower than the depth of a lower end of the charge retaining region 4 and that the photoelectric conversion region 3 is formed only on the lower side of the indented region 20 without extending to the lower side of the charge retaining region 4.

This configuration is employed because the photoelectric conversion region 3 extending to the charge retaining region 4 leads to the photoelectric conversion region 3 and the charge retaining region 4 connected to each other, meaning that the photoelectric conversion region 3 cannot be expanded to the charge retaining region 4.

The charge transfer gate electrode 6 is formed over the epitaxial layer 2 to cover the charge retaining region 4, extends along the side walls of the indented region 20 to reach the bottom surface, extends along a part of the bottom surface, and overlaps with the photoelectric conversion region 3 and the charge retaining region 4.

When voltage is applied to the charge transfer gate electrode 6, the charge as a result of the conversion by the photoelectric conversion region 3 is transferred from the photoelectric conversion region 3 to the charge retaining region 4, through the charge transfer gate electrode 6.

Modified Example of Second Embodiment

Figure 19:
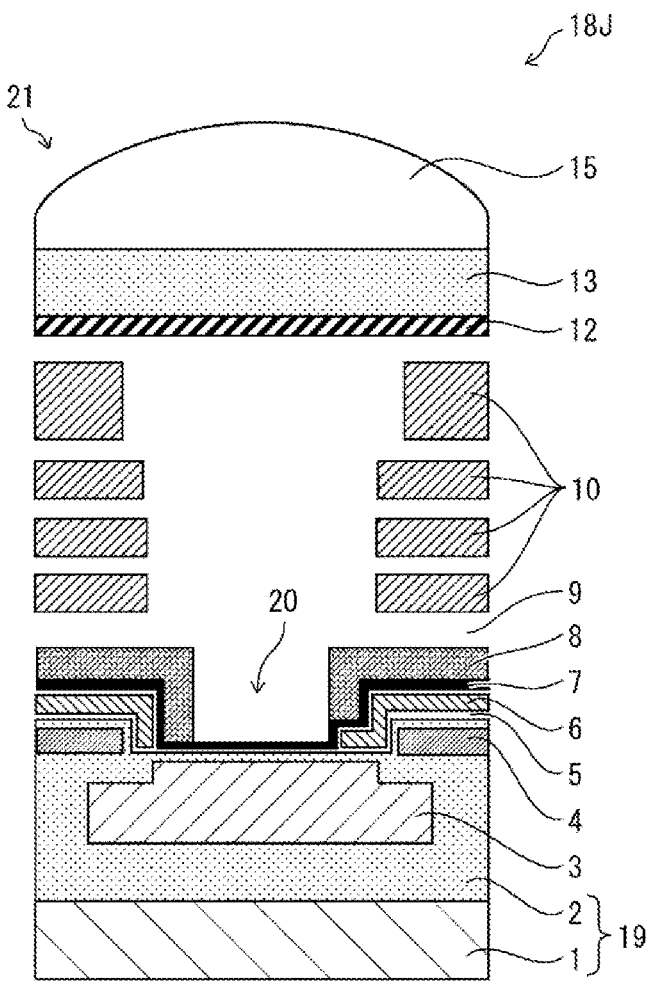
FIG. 19 is a structural cross-sectional view of a pixel of a solid-state imaging device according to a modified example of the second embodiment.

FIG. 19 is a structural cross-sectional view of a pixel 21 of a solid-state imaging device 18J according to a modified example of the second embodiment. A difference from the solid-state imaging device 18I of the second embodiment is that a region of the photoelectric conversion region 3 (photodiode) on the deeper side extends to the lower side of the charge retaining region 4 (memory node).

For this photoelectric conversion region 3, impurity implantation is adjusted so that a potential slope from the deeper side toward the shallower side is formed, and charge generated on the deeper side also flows on the shallower side to be accumulated. Thus, the saturation capacity of the photoelectric conversion region 3 can fee increased from that of the configuration illustrated in FIG. 18.

Supplement

Solid-state imaging devices 18, 18A to 18J according to a first aspect of the present disclosure include: a plurality of pixels 21 arranged in a matrix form on a substrate 19, and the plurality of pixels 21 each include a photoelectric conversion region 3 disposed inside the substrate 19 and configured to convert light entering the substrate 19 into charge, a charge retaining region 4 disposed more on a side from which the light enters, than the photoelectric conversion region 3 inside the substrate 19 and configured to retain the charge converted in the photoelectric conversion region 3, an indented region 20 indented from a surface of the substrate 19 on the side from which the light enters, toward the photoelectric conversion region 3 to at least a depth corresponding to the charge retaining region 4, and a light blocking film 3 formed covering the charge retaining region 4 at the surface side of the substrate 19 and extending along a side wall of the indented region 20.

With the configuration described above, the charge retaining region for retaining the charge as a result of the conversion in the photoelectric conversion region is disposed more on the side from which the light enters than the photoelectric conversion region inside the substrate. The indented region is indented from the surface of the substrate on the side from which the light enters, toward the photoelectric conversion region to be disposed at least at a depth corresponding to the charge retaining region. The light blocking film to block the light reaching the charge retaining region covers the side of the surface of the substrate of the charge retaining region, and extend along a side wall of the indented region.

Thus, the light blocking film covers not only the upper surface of the charge retaining region but also a side surface of the charge retaining region. As a result, a solid-state imaging device can be provided that is fundamentally free of occurrence of parasitic light sensitivity noise due to light, of the light that has entered the substrate, refracted and leaked into the charge retaining region.

In the first aspect, solid-state imaging devices 18, 18A to 18J according to a second aspect of the present disclosure preferably further include a charge transfer gate electrode 6, 6H configured to transfer the charge from the photoelectric conversion region 3 to the charge retaining region 4, and the charge is preferably transferred to the charge retaining region 4 through a charge transfer path reaching the charge retaining region 4 from the photoelectric conversion region 3 through the charge transfer gate electrode 6, 6H.

With the configuration described above, the charge converted from the light that has entered the substrate can be transferred from the photoelectric conversion region to the charge retaining region by applying voltage to the charge transfer gate electrode.

In solid-state imaging devices 18, 18A to 18H, 18J according to a third aspect of the present disclosure, the photoelectric conversion region 3 is preferably formed to extend from a lower side of the indented region 20 to a lower side of the charge retaining region 4.

With the configuration described above, the saturation capacity of the photoelectric conversion region can be increased.

In a solid-state imaging device 18H according to a fourth aspect of the present disclosure, the charge transfer gate electrode 6H is preferably embedded in the substrate (epitaxial layer 2) and covers a side surface of the charge retaining region 4.

With the configuration described above, the charge transfer gate electrode needs not to be provided on the indented region side of the charge retaining region, and the aperture of the light blocking film can be enlarged. As a result, the condensing rate of the photoelectric conversion region can be increased, and the sensitivity of the solid-state imaging device can be improved.

In solid-state imaging devices 18, 18A to 18J according to a fifth aspect of the present disclosure, the light blocking film 8 is preferably formed to have a single or multiple film structure achieving a higher light reflectivity than a tungsten single layer.

With the configuration described above, the reflectivity of the light blocking film for the light traveling toward the charge retaining region can be increased, so that the light blocking performance of the light blocking film can be increased and the amount of light traveling toward the photoelectric conversion region can be increased, whereby the sensitivity can be improved.

Solid-state imaging devices 18A, 18C, 18F, 18G according to a sixth aspect of the present disclosure preferably further include: an interlayer insulating film 9 formed on the light blocking film 8; and an optical waveguide 11 formed, on the interlayer insulating film 9, from a material having a refractive index different from a refractive index of the interlayer insulating film 9 and configured to guide the light to the photoelectric conversion region 3.

With the configuration described above, light entering the substrate can be efficiently guided by the optical waveguide to the photoelectric conversion region disposed on the lower side of the indented region.

Solid-state imaging devices 18D, 18E, 18F, 18G according to a seventh aspect of the present disclosure preferably further include: an interlayer insulating film 9 formed on the light blocking film 8; and an inner lens 16 formed on the interlayer insulating film 9 and configured to condense the light and to guide the light to the photoelectric conversion region 3, and the inner lens 16 is preferably formed from a material that is the same as a material configuring the interlayer insulating film 9 or at least one material having a refractive index that is different from a refractive index of the material configuring the interlayer insulating film 9.

With the configuration described above, light entering the substrate can be efficiently guided by the inner lens to the photoelectric conversion region disposed on the lower side of the indented region.

Solid-state imaging devices 18A, 18C, 18D, 18E, 18F, 18G according to an eighth aspect of the present disclosure preferably further include a passivation film 12 formed between the interlayer insulating film 9 and the optical waveguide 11 or between the interlayer insulating film 9 and the inner lens 16, and the passivation film 12 preferably has stress in a compressive direction of $-5.0\times10^{-9}$ dyne/cm$^2$ or less.

With the configuration described above, the dark current of the solid-state imaging devices can be exponentially reduced.

The present disclosure is not limited to each of the above-described embodiments. It is possible to make various modifications within the scope of the claims. An embodiment obtained by appropriately combining technical elements each disclosed in different embodiments falls also within the technical scope of the present disclosure. Furthermore, technical elements disclosed in the respective embodiments may be combined to provide a new technical feature.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A solid-state imaging device comprising:
    a plurality of pixels arranged in a matrix form on a substrate,
    wherein the plurality of pixels each includes
    a photoelectric conversion region disposed inside the substrate and configured to convert light entering the substrate into charge,
    a charge retaining region disposed more on a side from which the light enters, than the photoelectric conversion region inside the substrate and configured to retain the charge converted in the photoelectric conversion region,
    an indented region indented from a surface of the substrate on the side from which the light enters, toward the photoelectric conversion region to at least a depth corresponding to the charge retaining region, and
    a light blocking film formed covering the charge retaining region at the surface side of the substrate and extending along a side wall of the indented region.

2. The solid-state imaging device according to claim 1, further comprising:
    a charge transfer gate electrode configured to transfer the charge from the photoelectric conversion region to the charge retaining region,
    wherein the charge is transferred to the charge retaining region through a charge transfer path reaching the charge retaining region from the photoelectric conversion region through the charge transfer gate electrode.

3. The solid-state imaging device according to claim 2, wherein the charge transfer gate electrode is embedded in the substrate and covers a side surface of the charge retaining region.

4. The solid-state imaging device according to claim 1,
    wherein the photoelectric conversion region is formed extending from a lower side of the indented region to a lower side of the charge retaining region.

5. The solid-state imaging device according to claim 1,
    wherein the light blocking film is formed having a single or multiple film structure achieving a higher light reflectivity than a tungsten single layer.

6. The solid-state imaging device according to claim 1, further comprising:
    an interlayer insulating film formed on the light blocking film; and
    an optical waveguide formed, on the interlayer insulating film, from a material having a refractive index different from a refractive index of the interlayer insulating film and configured to guide the light to the photoelectric conversion region.

7. The solid-state imaging device according to claim 1, further comprising:
    an interlayer insulating film formed on the light blocking film; and
    an inner lens formed on the interlayer insulating film and configured to condense the light and to guide the light to the photoelectric conversion region,
    wherein the inner lens is formed from a material that is the same as a material configuring the interlayer insulating film or at least one material having a refractive index that is different from a refractive index of the material configuring the interlayer insulating film.

8. The solid-state imaging device according to claim 6, further comprising:
    a passivation film formed between the interlayer insulating film and the optical waveguide,
    wherein the passivation film has stress in a compressive direction of $-5.0\times10^{-9}$ dyne/cm$^2$ or less.

9. The solid-state imaging device according to claim 7, further comprising:
    a passivation film formed between the interlayer insulating film and the inner lens,
    wherein the passivation film has stress in a compressive direction of $-5.0\times10^{-9}$ dyne/cm$^2$ or less.

* * * * *